United States Patent
Krishnan et al.

(10) Patent No.: US 6,928,011 B2
(45) Date of Patent: Aug. 9, 2005

(54) ELECTRICAL FUSE CONTROL OF MEMORY SLOWDOWN

(75) Inventors: Manjeri Krishnan, Richardson, TX (US); Bryan Sheffield, Rowlett, TX (US); Joel J. Graber, Richardson, TX (US); Duy-Loan Le, Missouri City, TX (US); Sanjive Agarwala, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 10/630,963

(22) Filed: Jul. 30, 2003

(65) Prior Publication Data

US 2005/0024960 A1 Feb. 3, 2005

(51) Int. Cl.[7] .............................................. G11C 29/00
(52) U.S. Cl. ...................................... 365/201; 365/200
(58) Field of Search .............................. 365/201, 225.7, 365/200

(56) References Cited

U.S. PATENT DOCUMENTS

| | | | | |
|---|---|---|---|---|
| 5,912,852 A | * | 6/1999 | Lawrence et al. | 365/201 |
| 5,995,424 A | * | 11/1999 | Lawrence et al. | 365/201 |
| 6,373,747 B1 | * | 4/2002 | Harari et al. | 365/185.09 |

* cited by examiner

*Primary Examiner*—Van Thu Nguyen
*Assistant Examiner*—Tuan T. Nguyen
(74) *Attorney, Agent, or Firm*—Robert D. Marshall, Jr.; W. James Brady, III; Frederick J. Telecky, Jr.

(57) ABSTRACT

Electrical fuses (eFuses) are applied to the task of memory performance adjustment to improve upon earlier fuse techniques by not requiring an additional processing step and expensive equipment. Standard electrical fuse (eFuse) hardware chains provide a soft test feature wherein the effect of memory slow-down can be tested prior to actually programming the fuses. Electrical fuses thus provide a very efficient non-volatile method to match the logic-memory interface through memory trimming, drastically cutting costs and cycle times involved.

18 Claims, 6 Drawing Sheets

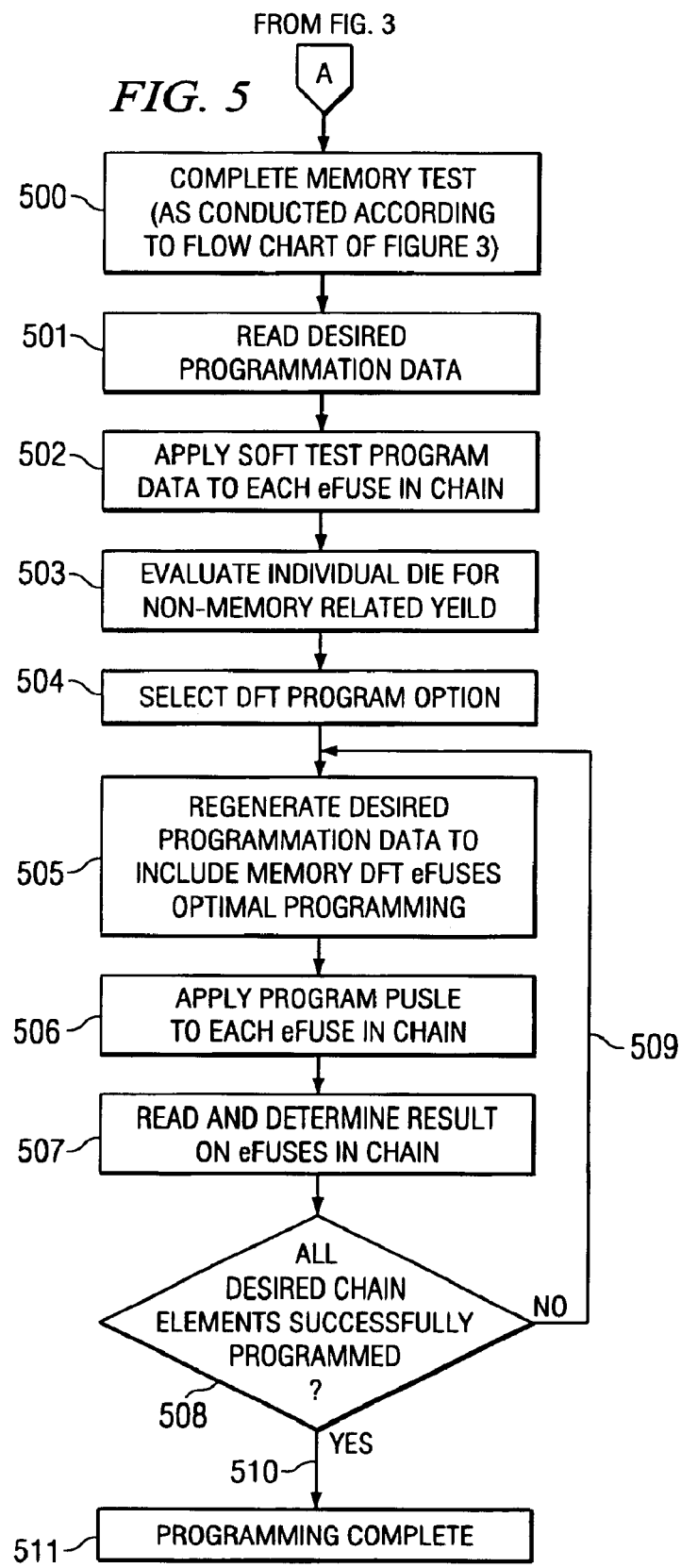

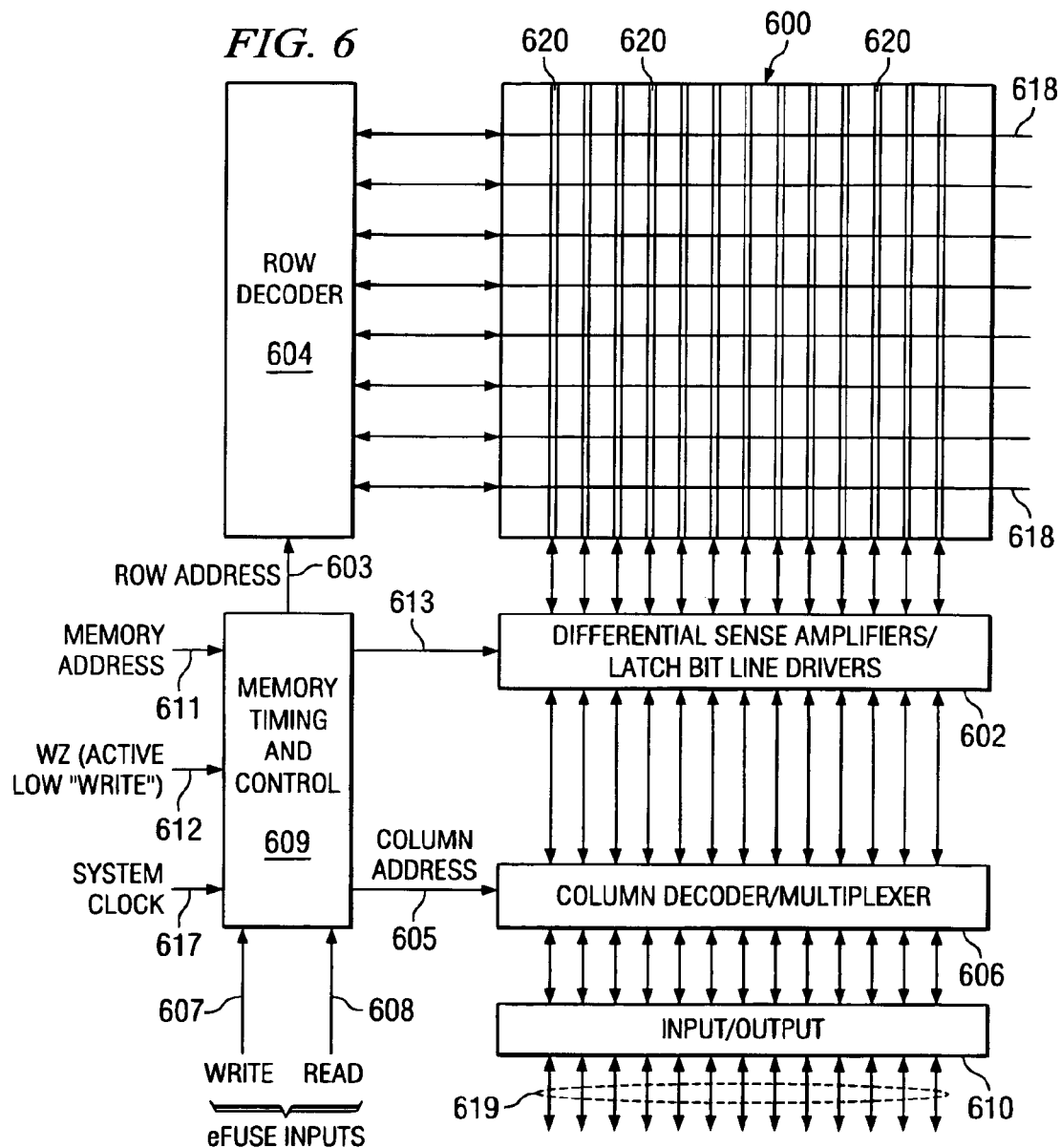

ELECTRICAL FUSE CONTROL OF MEMORY SLOWDOWN

TECHNICAL FIELD OF THE INVENTION

The technical field of this invention is control of memory speed of operation on an integrated circuit including both a microprocessor and memory.

BACKGROUND OF THE INVENTION

Microprocessor chips fabricated with current CMOS technology are designed with great care to comprehend the circuit performance variations that occur as the process shifts from one tolerance extreme to the other. Designers have become accustomed to speak of MOS transistors having maximum drive capability as strong transistors and MOS transistors with minimum drive capability as weak transistors. At both of these extremes, the transistors are within specified process tolerance limits. It is desirable to maximize the useable yield of all functional devices even though different speed performance devices will be produced. Normally the whole performance distribution is salable.

In practice, designs are analyzed according to (a) transistor strength, (b) power supply voltage tolerances, (c) interconnect resistance and capacitance, and (d) operating temperature, among other possible parameters. Logic portions of the circuit must match as closely as possible the memory portions of the circuit and the interface should be optimized on every die as much as practical.

Experience has shown that to optimize overall yield, both memory designs and logic designs should carried out for highest possible speed performance considering all the design parameters. The most effective matching between elements of the logic and elements of memory has been shown to be achievable by adjusting memory performance downward incrementally as necessary to improve to usability of the full performance spread of the logic circuit portions. Hence, memory designers have conventionally designed-in memory trimming circuitry to incrementally lower the speed of the memory function. These memory trimming circuits are generally used to adjust the propagation delays in the read and write control circuits and have in some cases also been applied to adjustment of memory sense amplifier reference elements.

Pervious Techniques for Memory Trimming

Originally, memory trimming was achieved by utilizing spare gates by way of a revision of the chip interconnect pattern. This incurs significant costs and cycle times to produce revised photomask reticles and to complete fabrication of the revised product.

A later technique introduced to make memory trimming more practical laser fuses. Laser fuses built into the die may be blown to achieve many of the desired memory trimming adjustments. However, laser fuses must be large in chip area to ensure dependable laser beam hits.

Electrical Fuses for Programming

Electrical fuses (eFuses) are extremely attractive for this kind of application and have made a great impact on digital processor devices. Originally eFuses were applied to the obvious need for device programmability. The possibility of programming a device to do a specific task efficiently has made modest cost special purpose processors a reality. Many fusible interconnect links are constructed of materials such as deposited amorphous polysilicon.

These electrical fuses (eFuses) in VLSI silicon devices are programmed conventionally by applying a relatively large amount of power to the fuse body to melt and separate the fuse body material. This changes the eFuse resistance from a low pre-blow resistance to a high post-blow resistance. This result can be sensed to determine the state of the eFuse: unblown or blown.

Efuse Implementation

The eFuse for a conventional programmable device application is normally configured as a chain or two-dimensional array sometimes containing hundreds of eFuses and supporting logic. Several definitions will be helpful in clarifying the descriptions of eFuse implementation to follow.

1. The eFuse is a circuit element having a natural un-programmed state, but may be permanently programmed to the opposite state.

2. An eFuse element is an eFuse along with its programming and sensing circuits.

3. An eFuse cell is an eFuse element plus the local logic required to integrate it into an eFuse chain.

4. An eFuse chain is a collection of one or more eFuse cells connected in series or arrays.

5. An eFuse controller is the control logic designed to access the eFuse chains or arrays.

6. An un-programmed eFuse has a pre-defined maximum low resistance value.

7. A programmed eFuse has a pre-defined minimum high resistance value.

The eFuse chain is programmed by loading the desired fused state and non-fused state locations into a programming database containing a record for the individual elements of the entire chain. Then those values are programmed into each eFuse sequentially.

FIG. 1 illustrates the conventional eFuse cell circuit configuration, which includes an eFuse element 101 plus the local logic required to integrate it into an eFuse chain. CData flip-flop 103 is clocked by the Enable Clock 108 and stores cell data in the chain. PData flip-flop 102 is clocked by the Data Clock 106 and latches program data being passed into the eFuse cell.

In the program mode, incoming PData In 107 is latched into PData flip-flop 102. This data is programmed into the eFuse element on the occurrence of one or more program pulses at Program input 110. PData Out 116 passes to the eFuse cell via path 116. In the program mode, PData Out passes through multiplexers 104 and 105 and is latched into the CData flip-flop 102. VPP 109 is the programming power source input. Program data is passed serially to the next cell in the chain at PData Out line 116.

In the test mode, the CData flip-flop 103 latches the data from the present cell and passes it to Cell Data Out 115. This data from the present cell is passed through multiplexer 104 and multiplexer 105 as directed by Test input 111.

Initz input 112 acts to initialize all flip-flops in the cell chain prior to the programming cycle. Margin input 114 allows adjustment of the reference input for a differential amplifier so that the desired high resistance values specified for a program element may be modified.

FIG. 2 illustrates a simplified view of a conventional eFuse system having an eFuse controller 200 and a number of series-connected eFuse cells 201 through 205. Each cell 201 through 205 has the local logic of FIG. 1 for integrating the cells into an eFuse array. Cell 201 differs in that it provides storage for a burned in die identifier (die-ID). At the last stage of the array 205 PData Out 208 and CData Out 209 are passed back to the controller as required in the program and test modes. It should be noted that nodes labeled Cell Out (e.g. 206 and 207) provide a single bit digital output representing the state of that cell, both in the programmed state and in the soft test state. The soft test state gives a non-permanent condition that emulates the state that would have been established after the fuse is programmed.

SUMMARY OF THE INVENTION

Electrical fuses (eFuses) are used to control the memory slowdown. This improves upon earlier fuse techniques by not requiring an additional processing step and expensive equipment. Standard electrical fuse (eFuse) hardware chains provide a soft test feature allowing the effect of memory slow-down to be tested prior to actually programming the fuses. Upon successful testing the same wafer probe testing operation programs the eFuses fuses electrically. Since wafer testing is always necessary, no new manufacturing flow steps are required and material-handling overhead is minimal. Electrical fuses thus provide a very efficient non-volatile method to match the logic-memory interface through memory slow down. This cuts down costs and cycle times.

BRIEF DESCRIPTION OF THE DRAWINGS

These and other aspects of this invention are illustrated in the drawings, in which:

FIG. 5 illustrates the procedure of this invention for completing the non-memory testing of an individual die to determine optimal programming of other eFuse controlled circuitry;

FIG. 6 illustrates a cache memory functional block diagram including eFuse programming inputs designed to incrementally adjust critical timing in both read and write memory functions.

DETAILED DESCRIPTION OF PREFERRED EMBODIMENTS

This invention describes the use of custom eFuse programming for recovery of potential memory yield loss in complex processor devices containing cache memory. This custom programming is better in cost and testing time than earlier techniques. The read and write operations associated with memories in complex processor devices sometimes need to be given additional margins in order to function properly. Process variations may cause the timing of the differential sense read circuits and the critically timed write circuit elements used in such memories to be outside the requirements for proper operation. In these situations, the memory can be made usable by increasing the memory timing. This leads to recovery of memory yield. This technique is referred to as the memory trimming or memory slow-down.

Electrical fuses (eFuse) are widely used for redundant RAM repair and die-identification (die-ID). Supplemental bits may be incorporated in the die-ID chain portion of the eFuse network to control slow down of the read and write operations of the memories. Conventional memory designs provide two or more pins dedicated to features commonly referred to as design-for-test (DFT) pins. This invention includes the use of these DFT pins. Drive of the DFT pins in a prescribed manner causes incremental additional margins in the timings of the read and write operations of the memories. This slows down the read and write operations. The cell output nodes of eFuses in the die-ID intended for this purpose drive these pins. This enables discretionary control of memory slow-down.

eFuses are easily programmed during wafer probe testing. The effect of the programming may be tested initially without actually programming the eFuses using a soft test feature.

Figure 3:
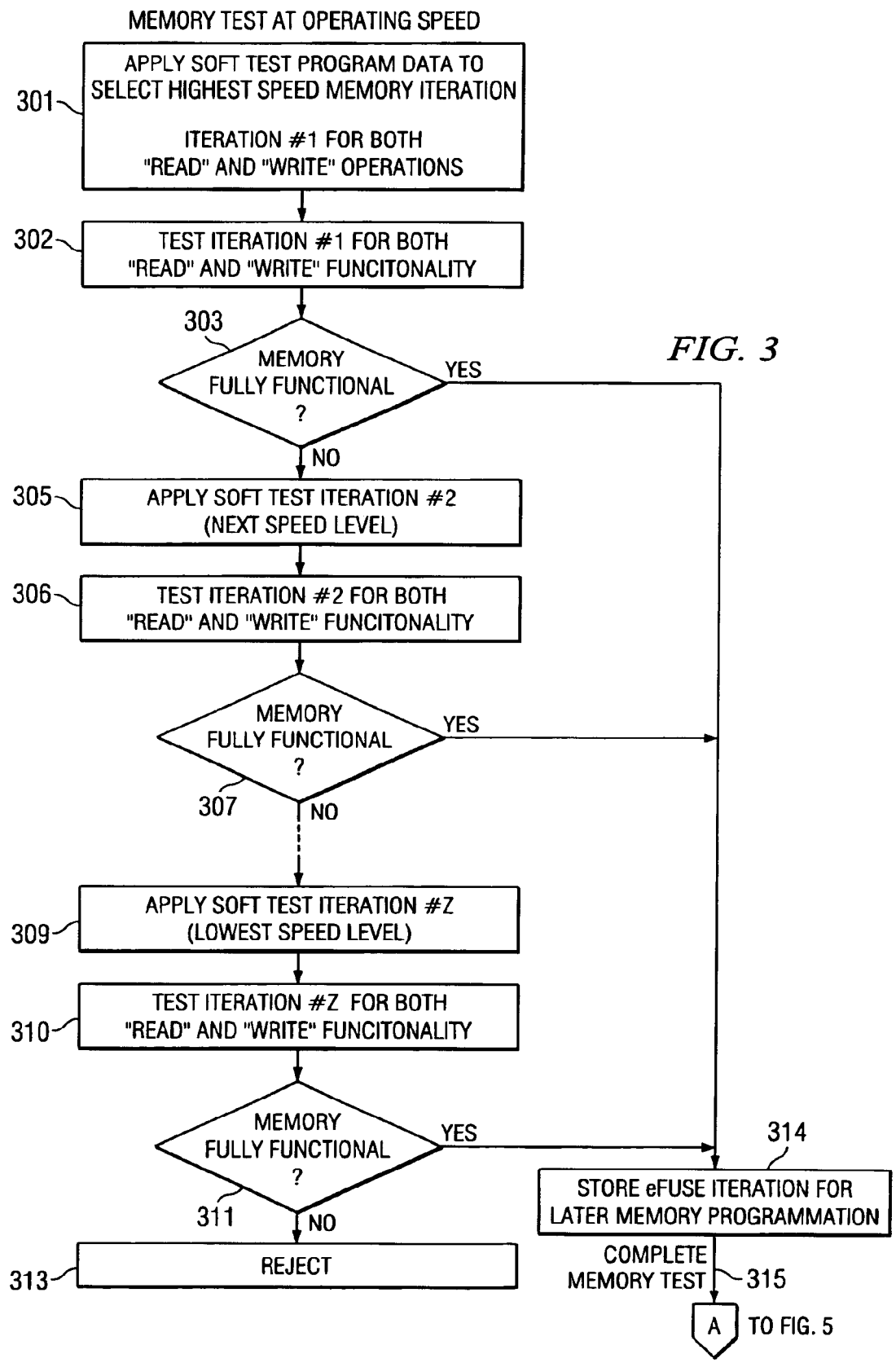
FIG. 3 illustrates the procedure of this invention for memory testing of an individual die to determine optimal programming of the eFuse driven cache memory design-for-test (DFT) pins.

FIG. 3 illustrates the procedure of this invention for memory testing of an individual die to determine optimal programming of the eFuse driven cache memory DFT pins. In block 301 the eFuses are soft programmed to select the highest speed read and write memory iteration. Full memory test 302 follows for this test iteration #1. Memory functionality query 303 determines whether for a Yes result to store this programming iteration in block 314 or for a no result to apply soft test iteration #2 in block 305. This soft test iteration #2 is the next slower memory speed.

Another full memory test 306 follows for test iteration #2. Memory functionality query 307 determines whether for a Yes result to store 314 this programming choice #2 or for a No result to result apply the next soft test iteration. This process repeats until a final soft programming in iteration #Z representing the slowest memory speed in block 309.

Final memory functionality query 311 determines whether for a Yes result to store 314 this programming choice #Z or for a No result to reject the die 313 as not functional at slowest usable speed. From block 314, die testing proceeds to the flow of FIG. 5 described later.

Figure 1:
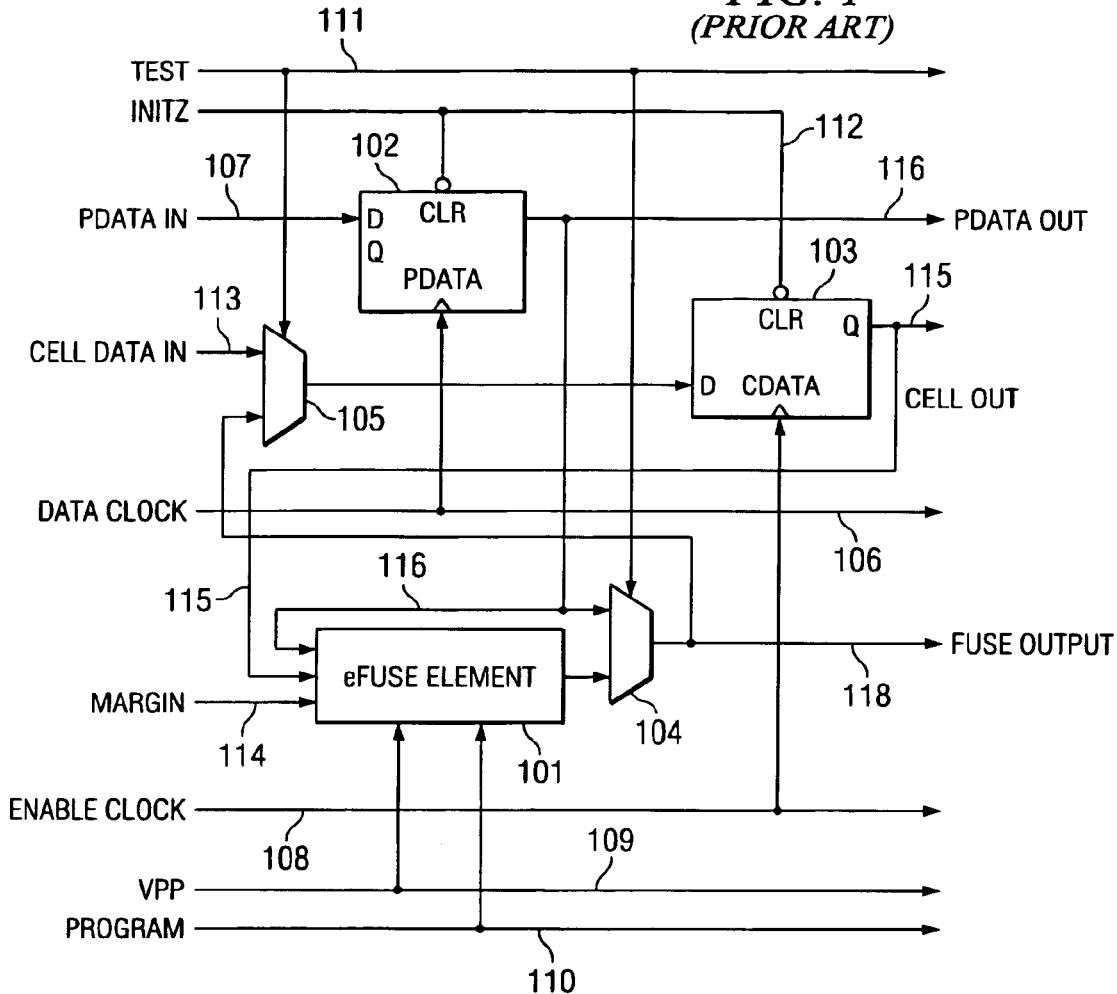
FIG. 1 illustrates the conventional eFuse cell circuit configuration including an eFuse element plus the local logic required to integrate it into an eFuse chain (Prior Art)
Figure 4:
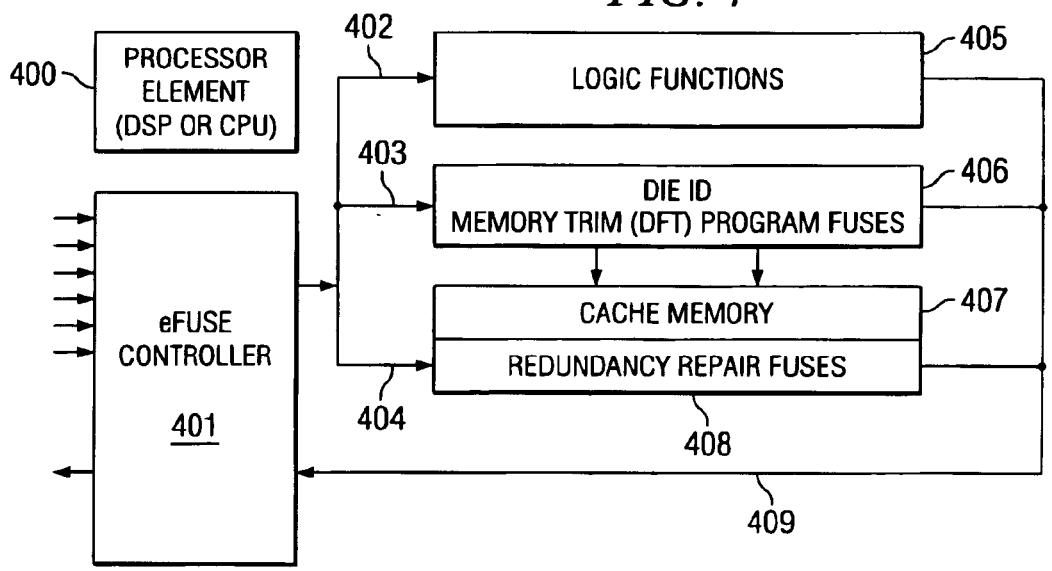
FIG. 4 illustrates a simplified example of a processor device having logic and cache memory and employing an eFuse controller and eFuse chains according to the technique of this invention.
Figure 2:
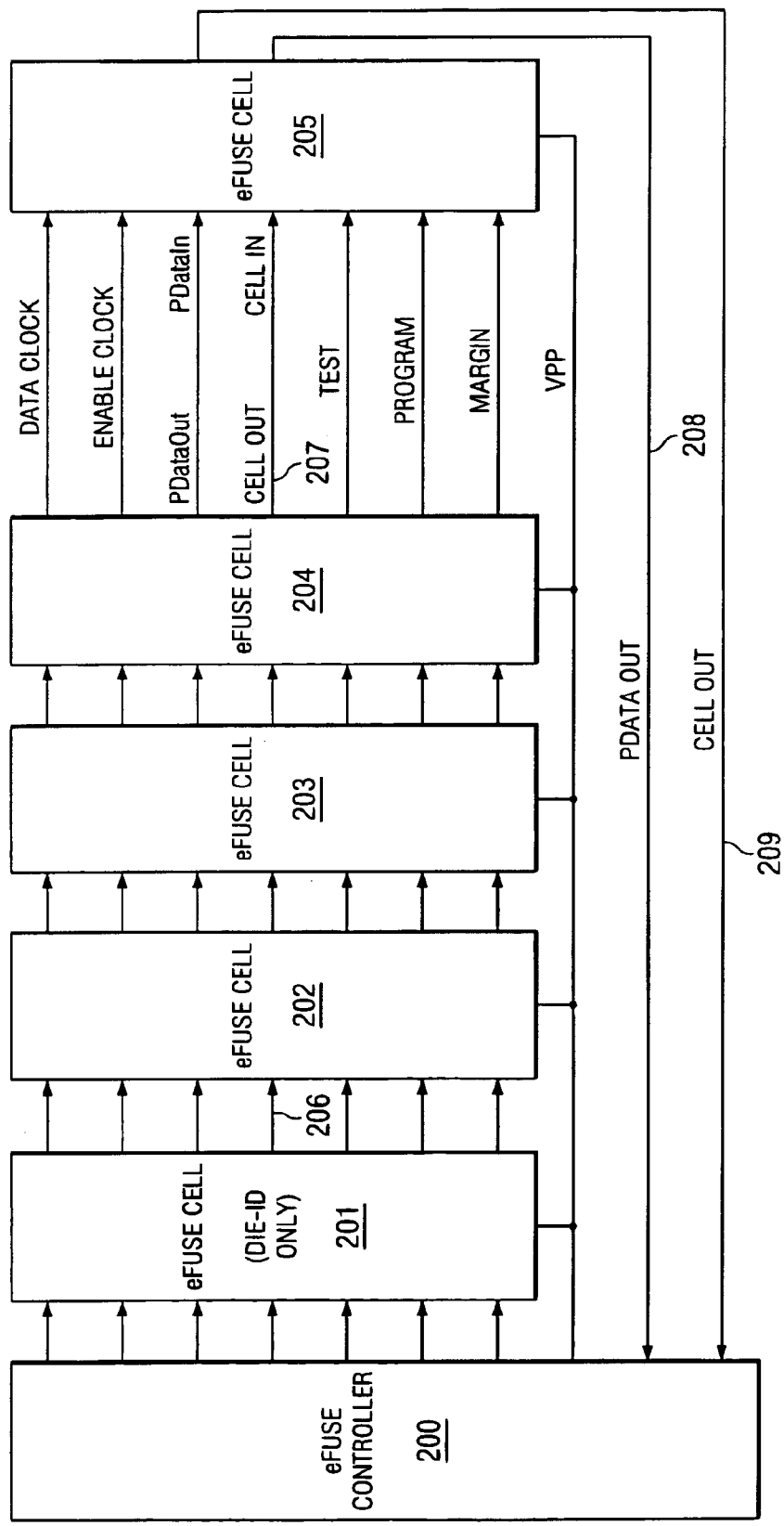
FIG. 2 illustrates a simple conventional eFuse system having an eFuse controller and a number of series-connected eFuse cells integrated into an eFuse array (Prior Art)

FIG. 4 illustrates an example of the hardware in a programmable device containing cache memory. Processor element 400 resides on a chip with logic functions 405 and cache memory 407. The eFuse controller 401 drives three eFuse chains 402, 403 and 404. Chain 402 contains the eFuses that program special features of the logic functions 404. Chain 403 contains the eFuses that form the die-ID 406 for later automatic chip identification during testing. Claim 403 also includes the DFT eFuses that act to trim the memory interface portion for optimal yield. Chain 404 contains the eFuses that perform special redundancy repair 408 within the cache memory 407. The return loop for all three chains is shown collectively by path 409 returning to the eFuse controller 401.

FIG. 5 illustrates the procedure for wafer testing and programming the full complement of eFuses on a given die. Step 500 is the memory testing illustrated in FIG. 3. Step 501 reads desired memory and non-memory programming data passes this to the eFuse controller (see 401 of FIG. 4). Step 502 applies the programming data to the efuse chains using the soft program feature. Step 503 evaluates the detailed non-memory eFuse programming for each die for overall yield. Step 504 selects the optimal programming options. Step 505 begins the final programming operations by regenerating the programming data.

Step 506 subjects the eFuses for each chain to program pulses. These eFuses are blown according to the regenerated program data input. Step 507 reads out the program results. Step 508 compares these results to the desired data. If results are satisfactory (Yes result 510), programming is complete at block 511. If results are unsatisfactory (No result 509), then the program returns to step 505. This repeats step 506 for eFuses which were to be blown but incorrectly remained unblown. This repeats until all eFuses are properly blown (Yes result 510).

Typical Memory Structure

FIG. 6 illustrates a typical cache memory structure to which eFuse memory trimming can be applied. The memory array 600 includes a dense set of memory cells arranged in rows and columns. A pair of bit lines 620 with double rail data (data true and complement) is routed through each column. Memory address bits 611 include row address bits 603 and column address bits 605. Row address decoder 604 receives row address bits 603 and drives the corresponding row line. Column address decoder/multiplexer 606 receives column address bits 605 and selects the corresponding pair of bit lines 620.

Writing to the memory is active when Wz signal 612 is low. Input/output block 610 drives write data on dual rail bit lines 620 through the column decoder/multiplexer 606. Writing takes place only on words addressed by the active word line 618 and the active column addressed by column decoder/multiplexer 606. Read/Write control input 613 controls both the read and write cycle timing. eFuse inputs 607 and 608 represent all of the eFuse program lines to the memory for the respective write and read programming. eFuse inputs 607 and 608 can be as few as two lines but the need to extend the programming options to plural lines for plural read and write options is clear. eFuse inputs 607 and 608 correspond to known design-for-test DFT inputs with allow for memory slow-down in the write and the read cycle respectively.

Reading from the memory is active when Wz signal 612 is high. Reading uses differential sense amplifiers of block 602 to receive a small dual rail differential signal on the bit lines 620. The polarity this differential signal indicates the data stored at the addressed location. Timing control input 613 controls the timing of a read strobe placed during the read cycle and eFuse input 608 provides a design-for-test DFT input allowing for memory slow-down in the read cycle according to the present invention. Output data is latched in the output buffer portion of the input/output block 610 and read out at input/output bus 619.

Memory Read and Write Slowdown

Read cycle slow down gives additional time for a larger bit-line differential signals to build up before committing the read via a read strobe pulse. This read strobe pulse, delayed according to eFuse programming, drives the sample once and lock-on in the latch portion of block 602.

Slowing down the write cycle allows more time for the address bits to become stable and for build up of increased amplitude in the dual rail drive signal. This signal is generated in the word line driver portion of block 602. In the write cycle the design objective is to open the cell, write data to it, then close it in the minimum time to maximize performance and minimize power. The closing time for a write is determined by eFuse programming. Physically there is a maximum speed at which this can be accomplished. The design task targets the maximum speed with an incremental amount of margin.

The DFT pins 607 and 608 are used as eFuse inputs. These provide the ability to incrementally slow down both the read and write operations so that devices fabricated from weak transistors will function properly at a slightly lower memory speed.

Memory Timing in Memory-slowdown

Figure 7:
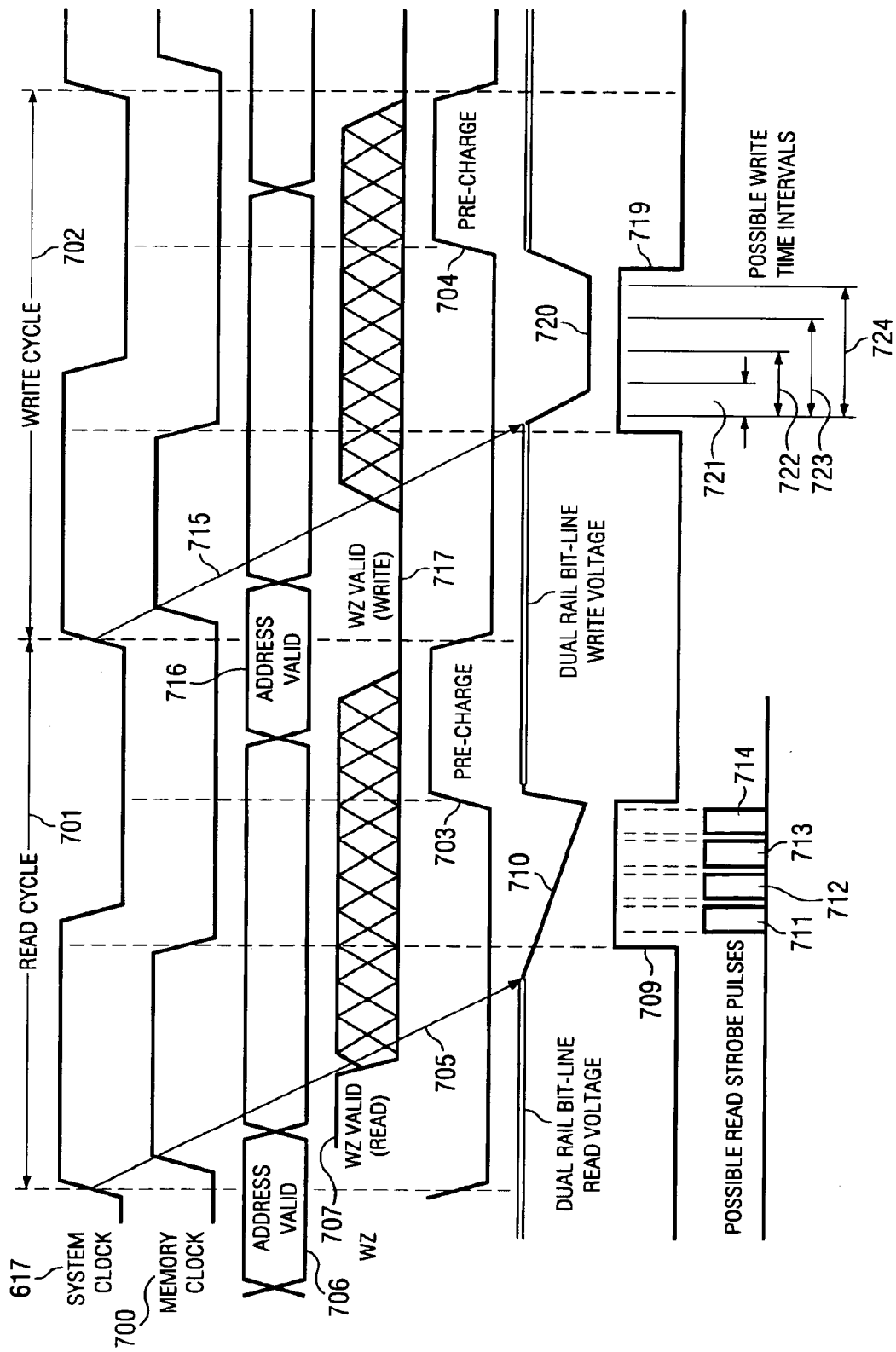
FIG. 7 illustrates the timing diagrams of equalize, read and write cycles of memory operation.

FIG. 7 illustrates a timing diagram showing the principles of memory slow-down via eFuse programming. One complete cycle for a memory read is depicted in read cycle 701. One complete cycle for a memory write is depicted write cycle 702. Pre-charge cycles 703 and 704 at the later portion of each of these cycles is devoted to equalization, during which each pair of bit lines is forced to the most positive voltage level in the circuit. The read cycle 701 and write cycle 702 are further divided into three time intervals.

System clock 617 synchronizes all memory operations. Memory timing and control block 609 internally generates other timing signals. Memory designs differ in many timing details. Memory clock 700 illustrates one such timing signal with timing edges adjustable via eFuse programming to determine (a) read strobe timing and (b) write interval closure. If read strobe may be placed early in read cycle and write interval closure may be placed early in write cycle, then the system clock frequency can be increased.

At the start of read cycle 701 initiated at time 705 by system clock 617, the row/column decoders take in a valid memory address 706 and generate row and column addresses for bit cells within a specific word. With read/write signal Wz 707 high, indicating a read cycle, system clock 617 initiates the build-up of a bit line read voltage signal 710. The addressed bit cells place voltages representing the stored data on the small dual rail bit-lines. These differential voltages will be detected by the differential sense amplifiers (602 of FIG. 6) and latched by action of a strobe pulse placed in time at an optimum point during time interval 709 for data detection. Four time options 711, 712, 713 and 714 are illustrated during time interval 709 as possible eFuse programming choices. One of the strobe pulses 711 through 714 will be used for the optimal value of sense voltage amplitude 710.

In a write cycle 702, read/write signal Wz 717 is low and the system clock 617 initiates the build-up of a bit line write drive signal 720. At write interval start time 715 the row/column decoders take in a valid memory address 716 and generate a valid decode to address bit cells within each word. Bit line drivers (602 of FIG. 6) place a relatively large dual rail voltage differential representing the data to be written and stored the addressed bit cells on bit-lines 620. These differential voltages will close at an optimum point during time interval 720 for forcing the bit latches into the store state. Four time options 721, 722, 723 and 724 during interval 719 are shown as possible eFuse programming choices. One of the write pulse closing times 721 through 724 will be used for the optimal value of write differential voltage amplitude 720.

What is claimed is:

1. A method of operating an integrated circuit including read accessible memory comprising the steps of:

testing memory read operations beginning at a maximum speed at successively slower speeds until all memory reads pass;

determining memory read program bits for a highest memory speed passing the memory read tests; and programming write once bits according to determined memory read program bits.

2. The method of claim 1 further comprising the steps of:

preliminary soft programming determined bits; and testing non-memory portions of the integrated circuit using soft programmed determined memory read program bits.

3. The method of claim 1 wherein:
said step of programming write once bits includes
applying program voltages to the bits,
testing the write once bits to determine achieved programming, and
repeating applying program voltages and testing the write once bits until the testing confirms correct write once bit programming.

4. The method of claim 1 wherein programming of write once bits includes:
merging of programming of write once bits for memory read speed with programming write once bits not related to memory speed.

5. The method of claim 4 wherein:
the write once bits not related to memory speed include a specific die-identification bit code.

6. The method of claim 4 wherein:
the write once bits not related to memory read speed include write once bits for memory redundancy programming.

7. The method of claim 4 wherein:
the write once bits not related to memory read speed include write once bits for control of programmable logic functions.

8. The method of claim 1, wherein the read accessible memory is write accessible, further comprising:
testing memory write operations beginning at a maximum speed at successively slower speeds until all memory reads pass;
determining memory write program bits for a highest memory speed passing the memory write tests; and
said step of programming write once bits according to determined memory read program bits further includes programming write once bits according determined memory write program bits.

9. The method of claim 1 further comprising the steps of:
operating memory read operations of the read accessible memory at a speed corresponding to the programmed write once memory read program bits.

10. The method of claim 8 further comprising the steps of:
operating memory write operations of the read accessible memory at a speed corresponding to the programmed write once memory write program bits.

11. A method of operating an integrated circuit including write accessible memory comprising the steps of:
testing memory write operations beginning at a maximum speed at successively slower speeds until all memory writes pass;
determining memory write program bits for a highest memory speed passing the memory write tests; and
programming write once bits according to determined memory write program bits.

12. The method of claim 11 further comprising the steps of:
preliminary soft programming determined write once bits; and
testing non-memory portions of the integrated circuit using soft programmed determined memory write program bits.

13. The method of claim 11 wherein:
said step of programming write once bits includes
applying program voltages to the write once bits,
testing the write once bits to determine achieved programming, and
repeating applying program voltages and testing the write once bits until the testing confirms correct write once bit programming.

14. The method of claim 11 wherein:
programming of write once bits includes merging of programming of write once bits for memory write speed with programming write once bits not related to memory speed.

15. The method of claim 14 wherein:
the write once bits not related to memory write speed include a specific die-identification bit code.

16. The method of claim 14 wherein:
the write once bits not related to memory write speed include write once bits for memory redundancy programming.

17. The method of claim 14 wherein:
the write once bits not related to memory write speed include write once bits for control of programmable logic functions.

18. The method of claim 11 further comprising the steps of:
operating memory write operations of the write accessible memory at a speed corresponding to the programmed write once memory write program bits.

* * * * *